(12) United States Patent
Masaki

(10) Patent No.: US 11,265,043 B2
(45) Date of Patent: Mar. 1, 2022

(54) COMMUNICATION CIRCUIT, COMMUNICATION SYSTEM, AND COMMUNICATION METHOD

(71) Applicant: SOCIONEXT INC., Kanagawa (JP)

(72) Inventor: Shunichiro Masaki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/806,891

(22) Filed: Mar. 2, 2020

(65) Prior Publication Data

US 2020/0204216 A1    Jun. 25, 2020

Related U.S. Application Data

(63) Continuation of application No. PCT/JP2017/031917, filed on Sep. 5, 2017.

(51) Int. Cl.
*H04B 5/00*      (2006.01)
*H03K 5/13*      (2014.01)
*H03L 7/081*     (2006.01)

(52) U.S. Cl.
CPC ............. *H04B 5/0075* (2013.01); *H03K 5/13* (2013.01); *H03L 7/0812* (2013.01)

(58) Field of Classification Search
CPC .......... H04B 5/0075; H04B 5/02; H03K 5/13; H03L 7/0812
See application file for complete search history.

(56) References Cited

U.S. PATENT DOCUMENTS

| | | | |
|---|---|---|---|
| 2008/0057875 A1* | 3/2008 | Kawashima | .......... H04L 1/0002 455/67.14 |
| 2012/0002771 A1* | 1/2012 | Nakagawa | .......... H04B 5/0081 375/354 |
| 2013/0324044 A1 | 12/2013 | Kuroda et al. | |
| 2014/0355935 A1 | 12/2014 | Kuroda et al. | |
| | (Continued) | | |

FOREIGN PATENT DOCUMENTS

| JP | S64077251 A | 3/1989 |
|---|---|---|
| JP | 2013-171298 A | 9/2013 |
| JP | 2014-033432 A | 2/2014 |
| | (Continued) | |

OTHER PUBLICATIONS

International Search Report and Written Opinion issued in Intenational Patent Application No. PCT/JP2017/031917 dated Oct. 10, 2017; with partial English translation.

*Primary Examiner* — Sam K Ahn
*Assistant Examiner* — Amneet Singh
(74) *Attorney, Agent, or Firm* — McDermott Will and Emery LLP

(57) ABSTRACT

A communication circuit includes a first buffer configured to output a signal indicative of a first logic state or a second logic state, a signal in which the first logic state and the second logic state are defined being input to the first buffer, a second buffer configured to output a signal indicative of any one of the first logic state, the second logic state, and a third logic state, the signal output from the first buffer being input to the second buffer, and a monitoring circuit configured to monitor a logic state indicated by the signal output from the first buffer and cause the second buffer, in a case where the logic state does not change during a first period, to output the signal indicative of the third logic state.

16 Claims, 16 Drawing Sheets

(56) References Cited

U.S. PATENT DOCUMENTS

2014/0375355 A1* 12/2014 Saito ................ H03K 19/00361
  326/34
2015/0207541 A1   7/2015 Kuroda

FOREIGN PATENT DOCUMENTS

JP   2014-183349 A   9/2014
WO   2012/111639 A1  8/2012

* cited by examiner

COMMUNICATION CIRCUIT, COMMUNICATION SYSTEM, AND COMMUNICATION METHOD

CROSS-REFERENCE TO RELATED APPLICATION

The present application is a continuation application of International Application No. PCT/JP2017/031917, filed Sep. 5, 2017. The contents of these applications are incorporated herein by reference in their entirety.

BACKGROUND OF THE INVENTION

1. Field of the Invention

The disclosures herein relate to a communication circuit, communication system, and communication method.

2. Description of the Related Art

In recent years, it has been known that a communication circuit (TLC (Transmission Line Coupler) circuit, a transmission line coupler) is provided between adjacent modules to perform wireless communication between modules by electromagnetic field coupling, and data communication between modules is performed by wireless communication.

This communication circuit is used for communication between modules using interface standards such as LVCMOS (Low Voltage CMOS) and LVDS (Low Voltage Differential Signaling).

The above communication circuit wirelessly transmits a "1" or "0" signal depending on data input from the module, and cannot continue to transmit a "1" or "0" signal. On the other hand, the standard for high-speed communication using differential output generally requires that the signal be transmitted in the unchanged state. For this reason, the conventional communication circuit described above cannot be used for communication between modules using a high speed communication standard.

The disclosed technology was developed in light of the above circumstances and is intended to improve versatility.
[Patent Document 1] International Publication No. 2012/111639
[Patent Document 2] Japanese Laid-Open Patent Application No. 2013-171298
[Patent Document 3] Japanese Laid-Open Patent Application No. 2014-033432

SUMMARY OF THE INVENTION

The disclosed technique is a communication circuit including a first buffer configured to output a signal indicative of a first logic state or a second logic state, a signal in which the first logic state and the second logic state are defined being input to the first buffer, a second buffer configured to output a signal indicative of any one of the first logic state, the second logic state, and a third logic state, the signal output from the first buffer being input to the second buffer; and, a monitoring circuit configured to monitor a logic state indicated by the signal output from the first buffer and cause the second buffer, in a case where the logic state does not change during a first period, to output the signal indicative of the third logic state.

DESCRIPTION OF THE PREFERRED EMBODIMENTS

First Embodiment

Figure 1:
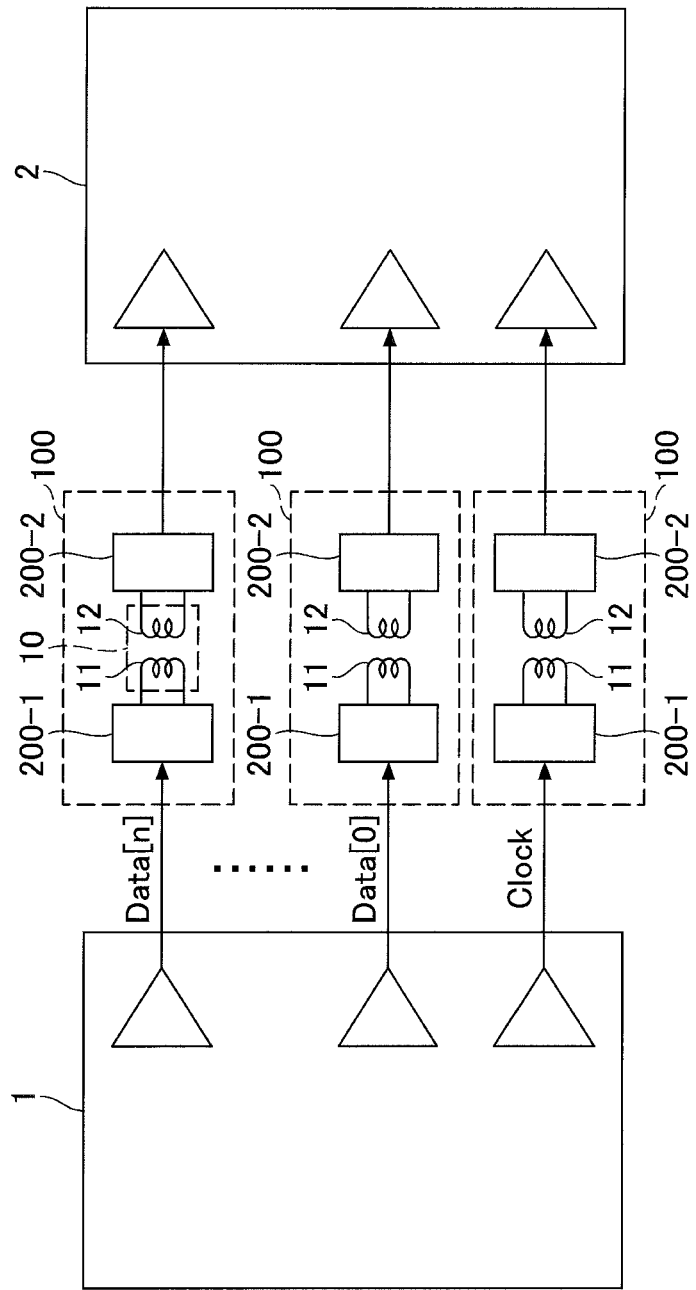
FIG. 1 is a diagram illustrating a communication system according to a first embodiment.

Hereinafter, the first embodiment will be described with reference to the drawings. FIG. 1 is a diagram illustrating a communication system according to a first embodiment.

The communication system 100 of the present embodiment includes a communication circuit 200-1 used as a transmitting side and a communication circuit 200-2 used as a receiving side. Because each of the communication circuits 200-1 and 200-2 has a similar configuration, in the following description, when the communication circuit 200-1 and the communication circuit 200-2 are not distinguished, they are simply referred to as the communication circuit 200.

The communication system 100 according to the present embodiment is connected between an LSI (Large-Scale Integrated circuit) 1 and an LSI 2 that communicates in accordance with a high-speed communication standard. Specifications for high-speed communication include, for example, PCI Express, SATA (Serial ATA), USB (Universal Serial Bus), and OIF (Optical Internetering Forum).

A communication circuit 200-1 is wired to LSI 1, and a communication circuit 200-2 is wired to LSI 2.

The communication circuit 200-1 converts a signal (data) received wirelessly from the LSI 1 into a wireless signal by the coil 11 connected to the communication circuit 200-1, and transmits the wireless signal by electromagnetic field coupling of the coil 11.

The communication circuit 200-2 receives a wireless signal transmitted from the coil 11 by the coil 12 connected to the communication circuit 200-2, reconstructs the received wireless signal into a wire signal, and outputs it to the LSI 2. That is, the coils 11 and 12 are couplers 10 that transmit signals wirelessly by electromagnetic field coupling between transmission lines.

In the communication system 100 of this embodiment, as described above, data communication between the LSI 1 and the LSI 2 is performed. In other words, the communication system 100 relays communication between LSI 1 and LSI 2.

In the example of FIG. 1, a plurality of communication systems 100 are provided between the LSI 1 and the LSI 2, but not limited thereto. The number of communication systems 100 provided between LSI 1 and LSI 2 may be optional. The communication system 100 may include a plurality of transmission-side communication circuits 200-1 and a plurality of reception-side communication circuits 200-2.

Next, prior to the description of the communication circuit 200 according to the present embodiment, the principle in which communication between transmission lines of the LSI is performed by wireless communication using an electromagnetic field coupling will be described with reference to FIGS. 2 to 4.

Figure 2:
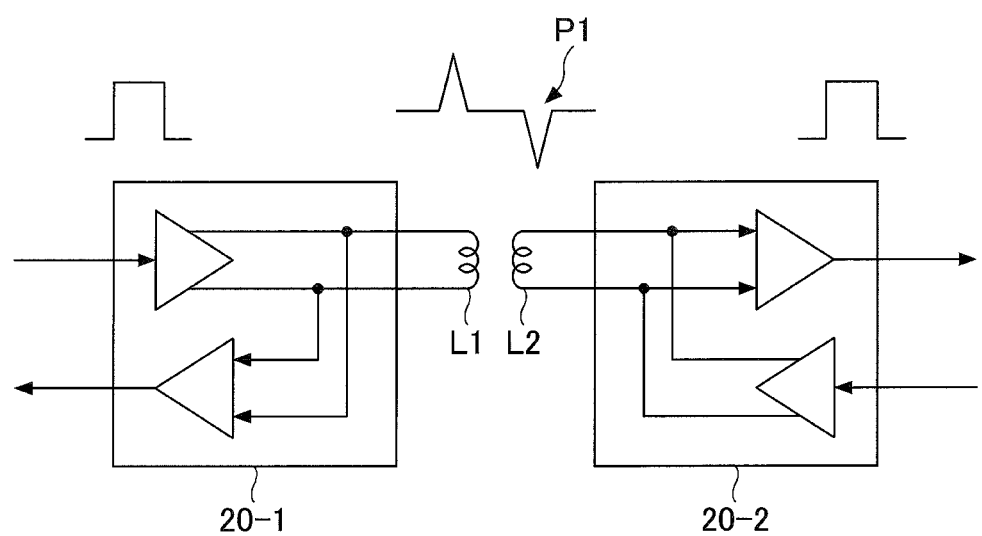
FIG. 2 is a diagram illustrating a case in which a single end signal is transmitted by wireless communication using an electromagnetic field coupling.

FIG. 2 is a diagram illustrating a case in which a single end signal is transmitted by wireless communication using an electromagnetic field coupling.

FIG. 2 illustrates an example in which the communication circuit 20-1 converts a single-end signal supplied over the wire into a wireless signal and transmits the signal to the communication circuit 20-2, and the communication circuit 20-2 receives the wireless signal, reconstructs the signal into a single-end signal, and outputs the signal over the wire.

In this case, the voltage at both ends of the coil L1 connected to the communication circuit 20-1 and the voltage at both ends of the coil L2 connected to the communication circuit 20-2 change at the change point of the single-end signal as illustrated in the waveform P1, and transmit a portion of the change point of the single-end signal as a signal. That is, the communication circuit 20-1 of FIG. 2 allocates and transmits each of the two states defined in the single-end signal to the wireless signal.

Figure 3:
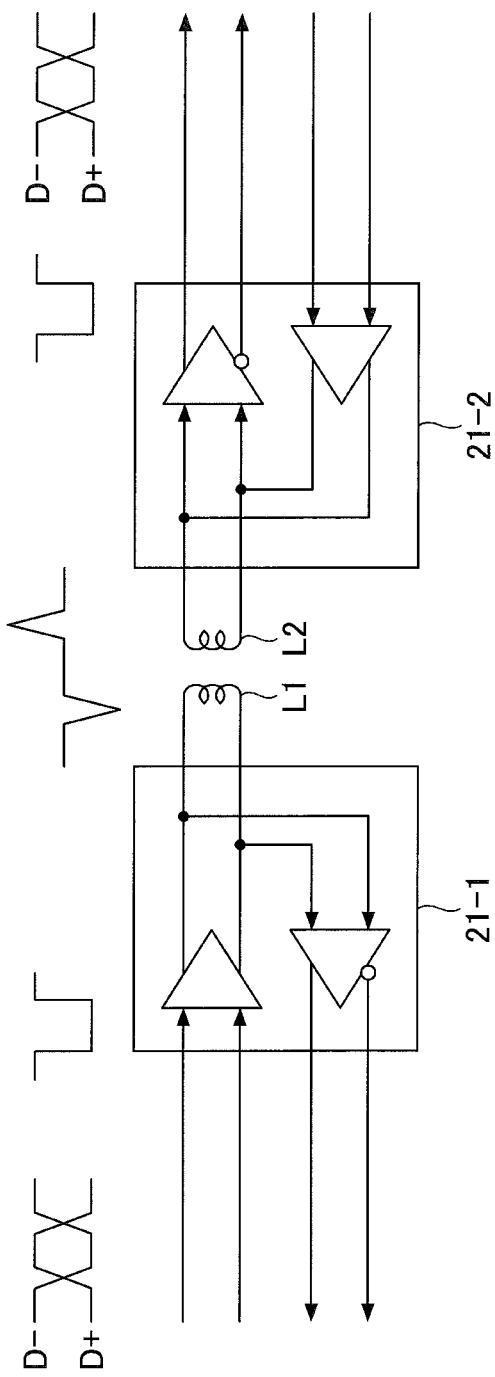
FIG. 3 is a diagram illustrating a case in which the differential output is transmitted by wireless communication using an electromagnetic field coupling.

FIG. 3 is a first diagram illustrating a case in which the differential output is transmitted by wireless communication using an electromagnetic field coupling.

In the example illustrated in FIG. 3, the communication circuit 21-1 converts the differential output supplied over the wire into a wireless signal and transmits it to the communication circuit 21-2. The communication circuit 21-2 receives the wireless signal, recovers the differential output, and outputs it over the wire.

The differential output according to this embodiment is a signal indicating the difference in voltage between two differential signal lines. The differential output becomes a high level when the difference in voltage between the differential signal lines is positive (a first logic state) and a low level when the difference in voltage between the differential signal lines is negative (a second logic state). The differential output according to this embodiment is a signal that retains the state of the previous data signal when the voltage between the differential signal lines does not change (a third logic state). The signal that retains the state of the previous data signal indicates the state when viewed from the side outputting the signal, and when viewed from the side inputting the signal, the signal is in a high impedance state. In other words, the differential output is a signal with three defined states.

Accordingly, the communication circuit 21-1 needs to allocate and transmit each of the three states indicated by the differential output to a wireless signal.

Hereinafter, the relationship between the differential output and the wireless signal converted from the differential output by the electromagnetic field coupling will be described with reference to FIG. 4. FIG. 4 is a diagram illustrating a relationship between a differential output and a wireless signal converted from the differential output by electromagnetic field coupling.

Figure 4:
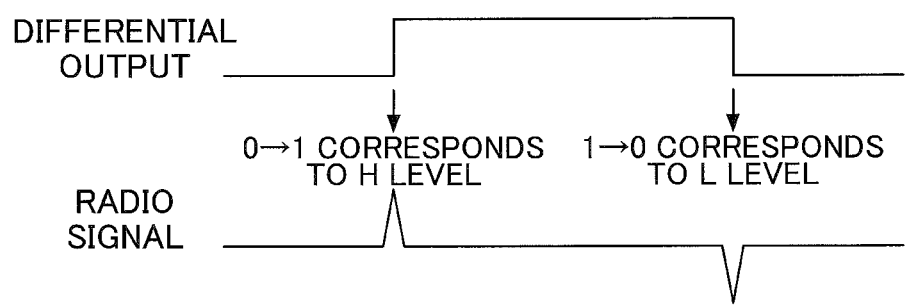
FIG. 4 is a diagram illustrating a relationship between a differential output and a wireless signal converted from the differential output by electromagnetic field coupling.

As illustrated in FIG. 4, the wireless signal transmits only the portion where the differential output is changed as information. More specifically, the wireless signal swings to the positive side when the differential output changes from a low level to a high level, and to the negative side when the differential output changes from a high level to a low level. Accordingly, when the differential output changes from a low level to a high level, or when the differential output changes from a high level to a low level, the information is transmitted, and the information is not transmitted when the differential output does not change. Accordingly, in the communication circuit 200 of this embodiment, a state in which the differential output does not change is detected and transmitted as information.

In this embodiment, by transmitting the three states represented by the differential output by the wireless signal as described above, it is possible to relay the communication between the LSIs 1 and 2 in which the communication circuit 200 performs communication according to the high-speed communication standard.

Figure 5:
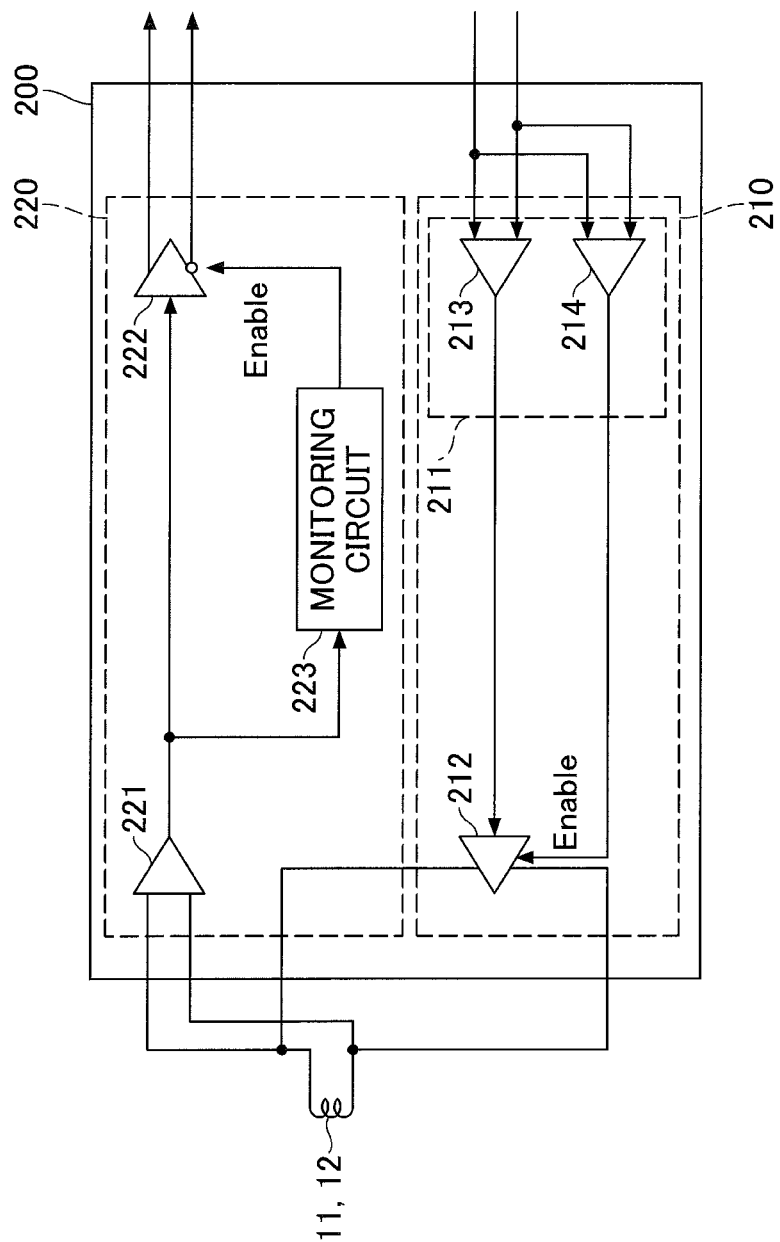
FIG. 5 is a diagram illustrating a communication circuit according to a first embodiment.

FIG. 5 is a diagram illustrating a communication circuit according to the first embodiment. The communication circuit 200 according to this embodiment includes a transmission circuit 210 and a reception circuit 220. The transmission circuit 210 and the reception circuit 220 in this embodiment are connected to the coil 11.

In the communication circuit 200 of this embodiment, for example, a control signal that activate either the transmission circuit 210 or the reception circuit 220 is input by an upper level circuit of the communication circuit 200.

Specifically, for example, when the control signal is input to the communication circuit 200 to activate the transmission circuit 210 and inactivate the reception circuit 220, the communication circuit 200 operates as the communication circuit 200-1 on the transmission side. When a control signal is input to the communication circuit 200 to activate the reception circuit 220 and inactivate the transmission circuit 210, the communication circuit 200 operates as the receiving communication circuit 200-2.

The communication circuit 200 according to this embodiment, for example, is connected to the LSI 1 and transmits the differential output input from the LSI 1 as a wireless signal when the transmission circuit 210 is activated. Also, the communication circuit 200 is connected with the LSI 2 and outputs the received wireless signal as differential output of the line to the LSI 2 when the reception circuit 220 is activated.

The transmission circuit 210 of this embodiment includes an amplitude detection circuit 211 and a buffer 212. The amplitude detection circuit 211 includes the buffers 213, 214.

A differential output from the LSI 1 is provided to one input and the other input of each of buffers 213 and 214. Specifically, the respective input terminals of buffers 213 and 214 are connected to the differential signal lines of the LSI 1.

The buffer 213 outputs a differential output input from the LSI 1 to the buffer 212. The buffer 213 outputs a high level signal when the differential output is positive and a low level signal when the differential output is negative.

The buffer 214 outputs to the buffer 212 an enable signal that activates the buffer 212 when the voltage difference between the differential signal lines is equal to or greater than a constant based on the voltage between the differential signal lines. In other words, the buffer 214 determines that there is a differential output when the voltage difference between the differential signal lines is equal to or greater than the predetermined value and activates the buffer 212, and determines that there is no differential output when the voltage difference between the differential signal lines is less than the predetermined value to disable the buffer 212.

According to the present embodiment, when the differential output exists, the buffer 212 is activated and the differential output from the buffer 212 is input into the coil 11. When there is no differential output, the buffer 214 transmits a disable signal that inactivates the buffer 212. Therefore, no signal is output from buffer 212.

In the communication circuit 200 according to this embodiment, the amplitude detection circuit 211 is provided to prevent operation by unstable signals due to noise or the like.

The output of the buffer 212 is connected to both ends of the coil 11. A current flows through the coil 11 in response to a signal supplied from buffer 212. In this embodiment, the signal output from the buffer 212 is transmitted to the receiving side by changing the voltage at both ends of the receiving side coil due to a change in the current flowing through the coil 11.

The reception circuit 220 of this embodiment includes buffers 221, 222 and a monitoring circuit 223. One input of the buffer 221 and the other input are each connected to terminals at both ends of coil 11 to output a signal corresponding to the voltage at both ends of coil 11.

The signal output from the buffer 221 is supplied to the buffer 222 and to the monitoring circuit 223. The buffer 222 is controlled to be activated/inactivated by the monitoring circuit 223. The buffer 222 outputs a signal output from the buffer 221 to the LSI 2 when enabled by monitoring circuit 223.

The monitoring circuit 223 includes, for example, a counter and counts to the first period. The monitoring circuit 223 outputs the disable signal that inactivates the buffer 222 to the buffer 222 when the value (level) of the signal output from the buffer 221 does not change during the first period. The buffer 222 receives the disable signal from the monitoring circuit 223 and sets the voltage between the differential signal lines to 0 [V].

That is, the monitoring circuit 223 according to the present embodiment is a monitoring circuit that causes a signal indicating that there is no differential output to be output from the buffer 222, in accordance with the differential output indicated by the signal output from the buffer 221.

When the value of the signal output from the buffer 221 changes, the monitoring circuit 223 outputs an activate signal to enable the buffer 222 to the buffer 222. In the monitoring circuit 223 of this embodiment, for example, the count value of the internal counter is reset each time the signal output from the buffer 221 changes.

In this embodiment, for example, the high-level signal output from the monitoring circuit 223 may be an enable signal for the buffer 222 and the low-level signal output from the monitoring circuit 223 may be a disable signal for the buffer 222.

The first period counted by the monitoring circuit 223 will now be described.

Typically, the differential output in a high-speed communication standard is embedded with a data signal and a clock signal to generate a clock signal from the data signal. In LIS for high-speed communications, a capacitor is used to prevent the DC component from being propagated, thereby suppressing the effect of the difference in power supply voltage between the LSIs in the transmission of differential output.

In addition, in LIS for performing high-speed communication, in order to achieve the generation of the clock signal described above and suppression of the influence of the difference in power supply voltage, the transmitted signal is converted from 8 bits to 10 bits and coded so that the frequency of occurrence of "1" and "0" is the same. Therefore, most of the transmitted signals are signals with a transition of values within a certain period of time. In other words, when most of the transmitted signals are transmitted by "1" or "0" data signals, the same values are not consecutive for more than a certain period. When the same value is continuously used for a certain period or longer, the differential output does not change.

The inventor of the present application has taken note of the foregoing and defined a first period of time during which the monitoring circuit 223 counts the same value ("1" or "0") consecutively in a signal transmitted by high speed communication. In this embodiment, this first period is the period of 5 bits of the data signal. It should be noted that the first period counted by the monitoring circuit 223 is not limited to a period of 5 bits of the data signal but may be a period of 5 bits or more.

Accordingly, in this embodiment, when there is no transition (change) in the value of the signal even though the count value in the monitoring circuit 223 is 5 or more, the buffer 222 is inactivated and the differential output is set to 0 [V].

In this embodiment, by controlling the output of the buffer 222 by the monitoring circuit 223 as described above, it is possible to detect and reproduce "a state in which the differential output does not change" from a wireless signal received by the coil 11.

Figure 6:
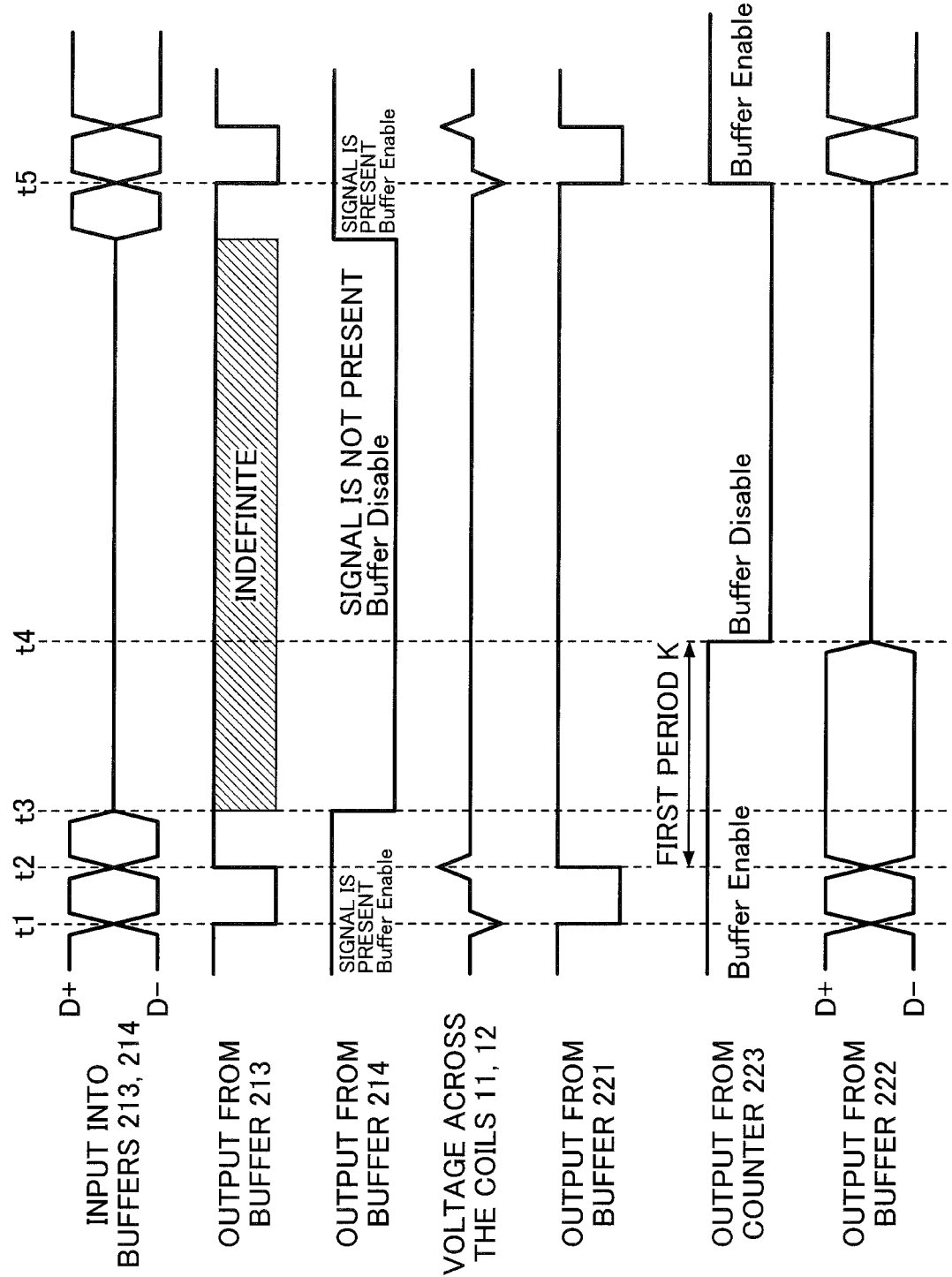
FIG. 6 is a timing chart explaining the operation of the transmission circuit of the communication circuit according to the first embodiment.

Hereinafter, the operation of the communication circuit 200 according to this embodiment will be described with reference to FIG. 6. FIG. 6 is a timing chart illustrating the operation of the transmission circuit of the communication circuit according to the first embodiment.

FIG. 6 illustrates a timing chart in which the differential output input to the buffers 213 and 214 of the communication circuits 200-1 is transmitted from the coil 11 to the communication circuits 200-2 as a wireless signal, and the communication circuits 200-2 restore and output the wireless signal received by the coil 12 to the differential output.

First, the operation of the communication circuits 200-1 and 200-2 at the timing t1 will be described.

At the timing t1 illustrated in FIG. 6, the differential output input to the buffers 213 and 214 inverts from the high level (hereinafter, the H level) to the low level (hereinafter, the L level). The buffer 214 outputs an H-level enable signal to the buffer 212 because there is a differential output.

Therefore, the signal output from the buffer 213 is output to the coil 11 via the buffer 212.

At the timing t1, the voltage across the coil 11 varies due to the differential output of the buffer 213 inverting from the H level to the L level. The voltage across the coil 12 varies in a manner similar to the change in the voltage across the coil 11 at the timing t1.

Accordingly, at the timing t1, the signal output from the buffer 221 of the communication circuit 200-2 varies from the H level to the L level in response to a change in the voltage across the coil 12. At this time, because the value of the signal output from the buffer 221 varies within the first period K, the monitoring circuit 223 outputs the enable signal to the buffer 222.

Because the buffer 222 is activated at the timing t1, the signal output from the buffer 221 is restored to a differential output and output.

Next, the operation of the communication circuits 200-1 and 200-2 at the timing t2 of FIG. 6 will be described.

At the timing t2, the differential output input to the buffers 213, 214 inverts from the L level to the H level. The buffer 214 outputs an H-level enable signal to the buffer 212 because there is a differential output. Therefore, the signal output from the buffer 213 is output to the coil 11 via the buffer 212.

At the timing t2, the voltage across the coil 11 varies with the signal output from the buffer 212 inverting from the H level to the L level, and the voltage across the coil 12 also varies.

Accordingly, at the timing t2, the signal output from the buffer 221 of the communication circuit 200-2 varies from L level to H level in response to a change in the voltage across the coil 12. At this time, because the value of the signal output from the buffer 221 varies within the first period K, the monitoring circuit 223 outputs an enable signal to the buffer 222.

At the timing t2, because the buffer 222 is activated, the signal output from the buffer 221 is restored to differential output and output.

Next, the operation of the communication circuits 200-1 and 200-2 at the timing t3 of FIG. 6 will be described.

At the timing t3, the differential output input to the buffers 213 and 214 becomes less than a constant difference in voltage between the differential signal lines, and the signal output from the buffers 213 becomes indefinite. The buffer 214 stops output of the enable signal to the buffer 214 and to the buffer 212. Therefore, no signal is output from the buffer 212.

At the timing t3, the communication circuit 200-2 does not receive a signal, so the signal output from the buffer 221 maintains the value of the timing t2. Further, at the timing t3, the value of the signal output from the buffer 221 is the same as the value of the timing t2, but K has not elapsed for the first period, so the monitoring circuit 223 outputs the enable signal to the buffer 222.

At the timing t3, because the buffer 222 is activated, a signal similar to timing t2 is restored to differential output and output.

Next, the operation of the communication circuits 200-1 and 200-2 at the timing t4 of FIG. 6 will be described.

At the timing t4, the communication circuit 200-2 does not receive a signal because the differential output input to the buffers 213, 214 remains indefinite.

At this time, the signal output from the buffer 221 has the same value as or more than the first period K consecutively. Accordingly, at the timing t4, the monitoring circuit 223 outputs a disable signal that disables the buffer 222. Specifically, the monitoring circuit 223 turns the H-level enable signal for enabling the buffer 222 into a disable signal for disabling the buffer 222 by inverting to the L-level at the timing t4.

At the timing t4, the buffer 222 is inactivated and a signal of 0V is output.

Next, the operation of the communication circuits 200-1 and 200-2 at the timing t5 of FIG. 6 will be described.

At the timing t5, the differential output input to buffers 213, 214 inverts, from an indefinite state, from the H level to the L level. The buffer 214 outputs an enable signal to enable the buffer 212 to the buffer 212. Thus, the signal output from the buffer 212 also inverts from the H level to the L level.

At the timing t5, the voltage across coil 11 varies with the signal output from the buffer 212 inverting from the H level to the L level, and the voltage across the coil 12 also varies.

Accordingly, at the timing t5, the signal output from the buffer 221 of the communication circuit 200-2 varies from the H level to the L level in response to a change in the voltage across the coil 12.

At the timing t5, the monitoring circuit 223 resets the count value and outputs an enable signal to activate the buffer 222 when the signal output from the buffer 221 is inverted from the H level to the L level.

At the timing t5, the buffer 222 receives the enable signal, restores the signal output from the buffer 221 to a differential output, and outputs the signal.

As described above, in the communication circuit 200-2 according to the present embodiment, the difference in voltage between the differential signal lines between the timing t4 and the timing t5 is detected as a state in which there is no change, and the voltage between the differential signal lines output from the buffer 222 can be set to 0 [V].

Accordingly, the communication system 100 according to the present embodiment can be used for data communication between LISs according to the standard of high-speed communication using differential output, thereby improving versatility.

Figure 7:
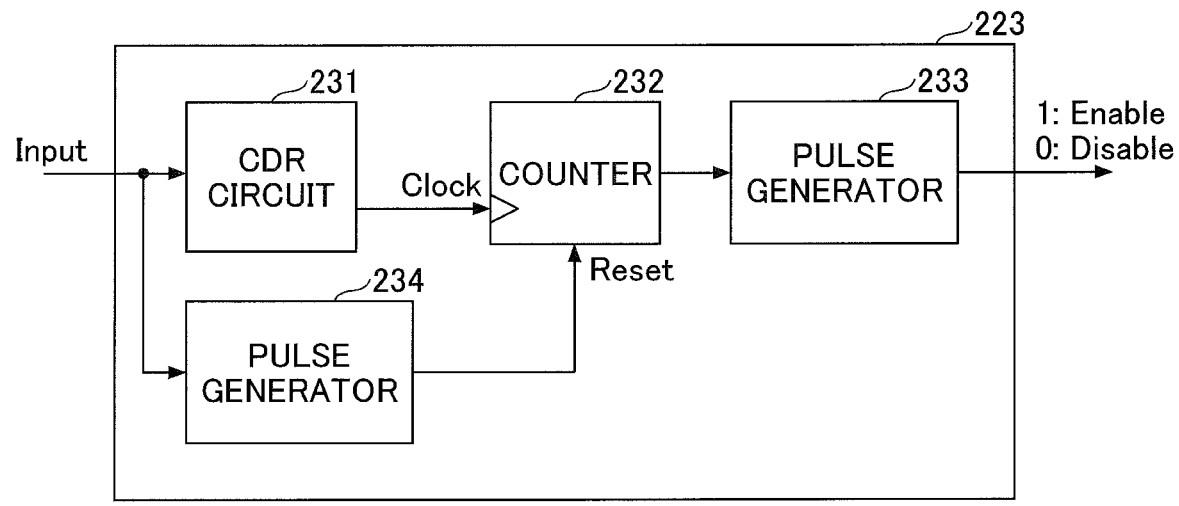
FIG. 7 is a diagram illustrating an example of a counter of the first embodiment.

Next, the monitoring circuit 223 of this embodiment will be described with reference to FIGS. 7 and 8. FIG. 7 is a diagram illustrating an example of a counter of the first embodiment.

The monitoring circuit 223 of this embodiment includes a CDR (Clock Data Recovery) circuit 231, a counter 232, and the pulse generators 233, 234.

The CDR circuit 231 and the pulse generator 234 receive a signal output from the buffer 221. The CDR circuit 231 separates the clock signal and the data signal contained in the signal output from the buffer 221 and outputs the clock signal to the counter 232.

When the pulse generator 234 detects inversion of the signal output from the buffer 221, it generates a pulse signal and outputs it to the counter 232. Specifically, the pulse generator 234 generates a pulse signal and outputs it to a counter 232 when the signal output from the buffer 221 is inverted from the H level to the L level and from the L level to the H level.

The counter 232 counts the number of pulses of the clock signal input from the CDR circuit 231 and outputs an L-level signal when the count number reaches a count value (the first set value), for example, 5 or more, corresponding to the above-described first period. When the pulse signal (reset pulse signal) is input from the pulse generator 234, the counter 232 resets the count value and outputs the H-level signal in synchronization with the signal input.

The pulse generator 233 generates and outputs the L-level signal when the H-level signal is input from the counter 232 until the count number of the counter 232 is equal to or more than a first set value, for example, 5, and the L-level signal is input from the counter 232 indicating that the count number is equal to or more than a first set value, for example, 5.

The H-level signal output from the pulse generator 233 is the enable signal to activate the buffer 222, and the L-level signal output from the pulse generator 233 is a disable signal to inactivate the buffer 222.

Figure 8:
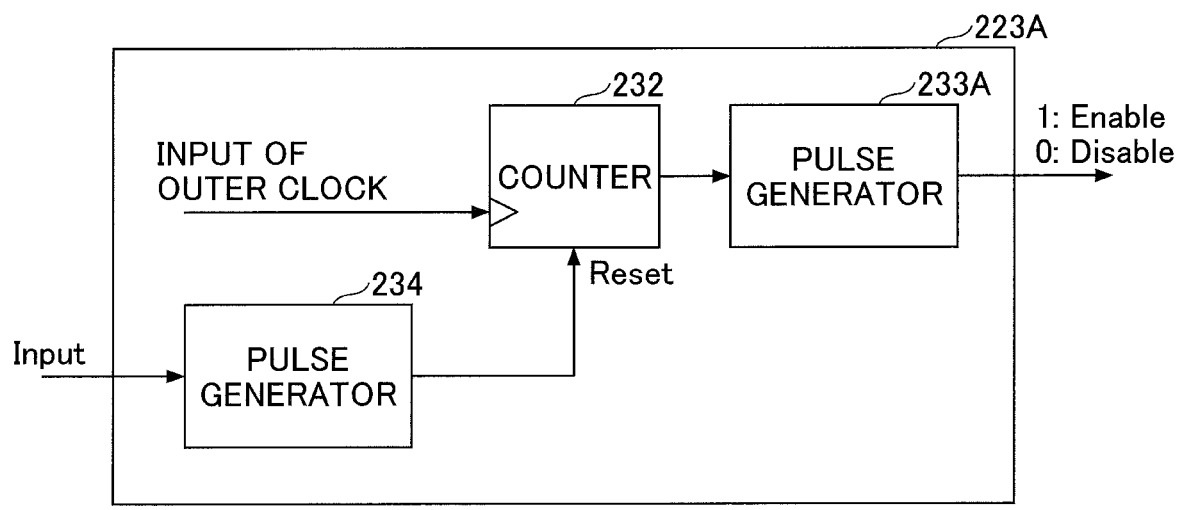
FIG. 8 illustrates another example of a counter in the first embodiment.

FIG. 8 is a diagram illustrating other examples of counters in the first embodiment. The monitoring circuit 223A illustrated in FIG. 8 includes a counter 232, and pulse generators 233A, 234.

In the monitoring circuit 223A, the clock signal input to the counter 232 differs from the monitoring circuit 223 illustrated in FIG. 7 only in that the clock signal is not generated by the CDR circuit 231 but is input from outside of monitoring circuit 223A.

Also in FIG. 8, the frequency of the external clock signal input to the monitoring circuit 223A is lower than the frequency of the data signal input to the communication circuit 200. Therefore, in the counter 232, the second set value is set to be smaller than the first set value in the counter 232 of FIG. 7, and the counter 232 outputs an L-level signal when the count number is equal to or more than the second set value. When the pulse signal (reset pulse signal) is input from the pulse generator 234, the counter 232 resets the count value and outputs the H-level signal in synchronization with the signal input.

The pulse generator 233A receives the H-level signal from the counter 232 and outputs the H-level signal until the count number of the counter 232 is equal to or more than the second set value. When the L-level signal indicating that the count number is equal to or more than the second set value is input from the counter 232, the pulse generator 233A generates and outputs the L-level signal. The H-level signal output from the pulse generator 233A is an enable signal to enable the buffer 222, and the L-level signal output from the pulse generator 233A is a disable signal to disable the buffer 222.

The clock signal input to the monitoring circuit 223A may be, for example, a clock signal supplied to the communication circuit 200.

The other operations in the monitoring circuit 223A are the same as the monitoring circuit 223 illustrated in FIG. 7, and therefore will not be described.

Next, another example of the communication system 100 according to this embodiment will be described with reference to FIG. 9. The communication circuit 200 according to the present embodiment includes, but is not limited to, a transmission circuit 210 and a reception circuit 220.

The communication circuit 200 may include, for example, only transmission circuit 210 or only reception circuit 220.

Figure 9:
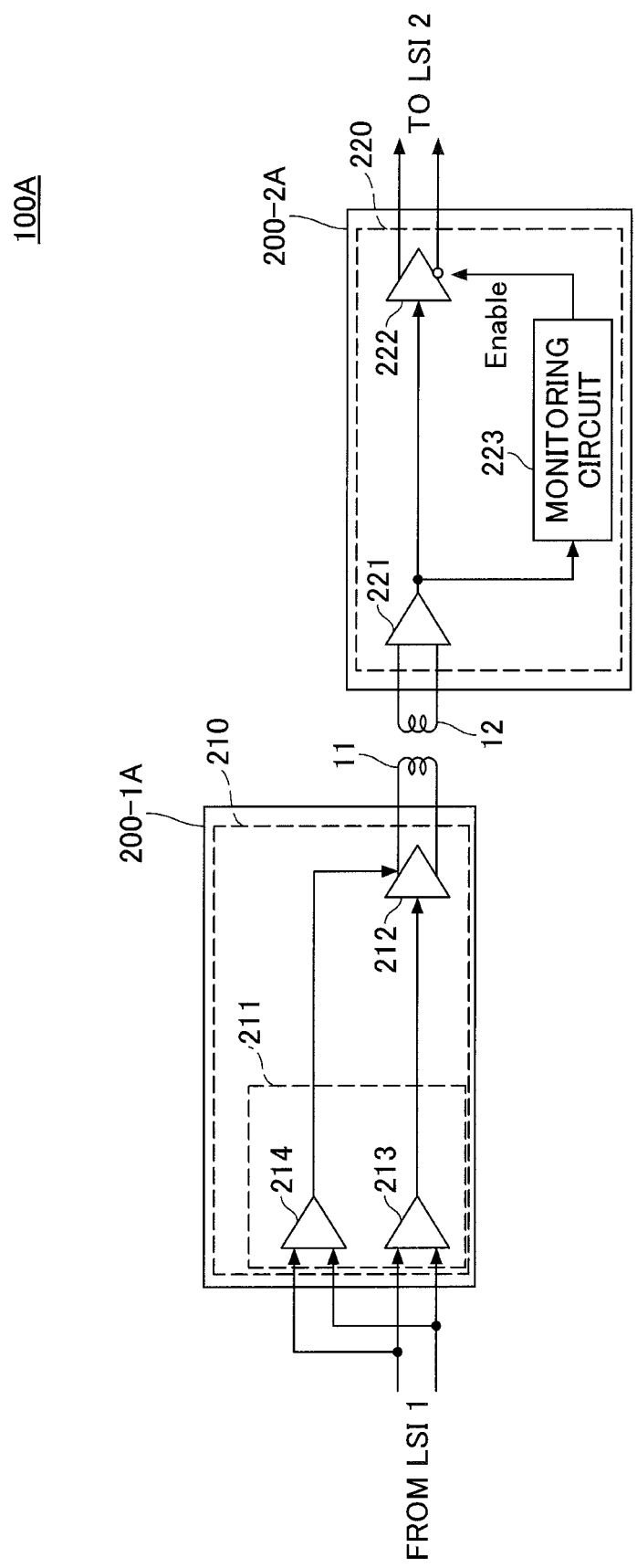
FIG. 9 is a diagram illustrating another example of a communication system according to the first embodiment.

FIG. 9 is a diagram illustrating another example of a communication system according to the first embodiment. In the communication system 100A illustrated in FIG. 9, the communication circuits 200-1A on the transmitting side include only the transmission circuit 210, and the communication circuits 200-2A on the receiving side include only the reception circuit 220.

In the communication circuit 200-1A, the output (differential signal line) of the buffer 212 of the transmission circuit 210 is connected to both ends of the coil 11. In communication circuit 200-2A, the input of buffer 221 is connected to both ends of coil 12.

In this embodiment, if the communication circuit 200 is configured to have only one of the transmission circuit 210 or the reception circuit 220, a control signal to enable either of the transmission circuit 210 or the reception circuit 220 is not required for the communication circuit 200.

As described above, the communication circuit 200 according to this embodiment can be applied to data communication that conforms to the high-speed communication standard. Accordingly, according to this embodiment, the versatility of the communication circuit 200 can be improved.

Second Embodiment

A second embodiment will now be described with reference to the drawings. The second embodiment differs from the first embodiment in that the communication circuit delays the timing of outputting the received signal for a period of time equivalent to the number of counts of the monitoring circuit. Accordingly, the following description of the second embodiment describes the differences between the first embodiment and the second embodiment. For those having a functional configuration similar to the first embodiment, the same codes as those used in the description of the first embodiment are given, and the description thereof is omitted.

Figure 10:
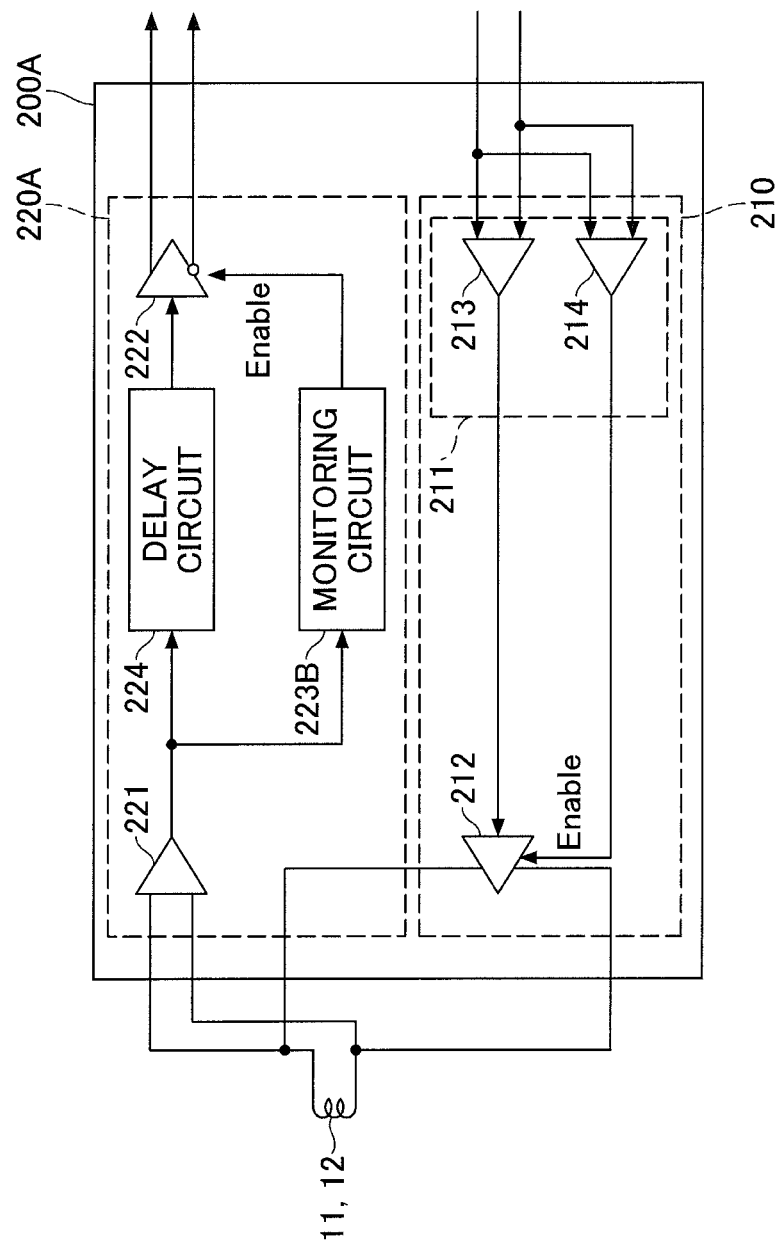
FIG. 10 is a diagram illustrating a communication circuit according to a second embodiment.

FIG. 10 is a diagram illustrating a communication circuit according to a second embodiment. The communication circuit 200A according to this embodiment includes a transmission circuit 210 and a reception circuit 220A.

The reception circuit 220A includes a buffer 221, a buffer 222, a monitoring circuit 223B, and a delay circuit 224.

The monitoring circuit 223B of this embodiment includes, for example, a counter and counts to the first period. The monitoring circuit 223B outputs a disable signal that inactivates the buffer 222 to the buffer 222 when the value of the signal output from the buffer 221 does not change during the first period K. The monitoring circuit 223B according to this embodiment outputs an enable signal that activates the buffer 222 following counting the first period K when a change in the value of the signal output from the buffer 221 is detected in the state where the disable signal is outputted.

Figure 11:
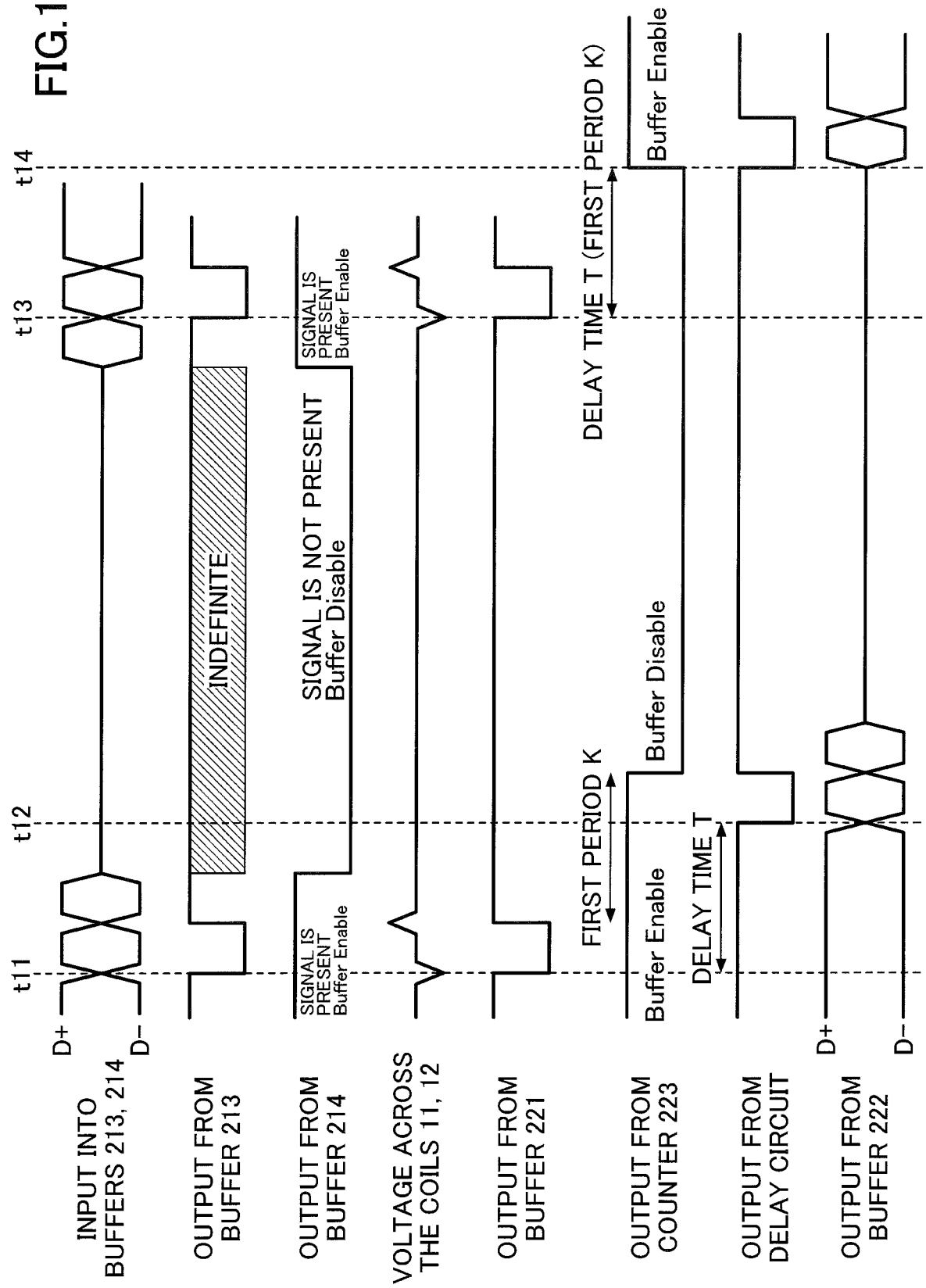
FIG. 11 is a timing chart explaining the operation of the communication circuit according to the second embodiment.

Referring to FIG. 6, the monitoring circuit outputs a signal for activating to the second buffer in synchronization with a reset of the counter when a count value before the reset of the counter is less than a first value corresponding to the first period. Referring to FIG. 11, the monitoring circuit outputs the signal for activating the second buffer following the counter counting to the first value after resetting when the count value before resetting of the counter is equal to or greater than the first value.

The monitoring circuit 223B may, for example, have a circuit configuration similar to the monitoring circuit illustrated in FIGS. 7 and 8, with the exception of the counter 232 configuration. In the monitoring circuit 223B, for example, in a state of the L-level signal being output, the counter 232 resets the count value when the reset pulse signal is input from the pulse generator 234 and outputs the H-level signal after the count number is equal to or more than the first or second set value. At this time, the counter 232 does not accept subsequent reset pulse signals until the count number exceeds the first set value or the second set value. On the other hand, in a state of the H-level signal being output, when the reset pulse signal is input from the pulse generator 234, the counter 232 resets the count value and outputs the H-level signal in synchronization with the input of the signal, and outputs the L-level signal when the count number is equal to or more than the first set value or the second set value.

The delay circuit 224 of this embodiment is provided between the buffer 221 and the buffer 222, and causes the timing of inputting the signal, output from the buffer 221 to the buffer 222 to be delayed by a predetermined delay time T.

At this time, it is preferable that the delay time T of the present embodiment be the same time as, for example, the first period K. Specifically, the delay circuit 224 may delay the signal output from the buffer 221 by 5 bits to output to the buffer 222.

Hereinafter, the operation of the communication circuit 200A according to this embodiment will be described with reference to FIG. 11. FIG. 11 is a timing chart illustrating the operation of a communication circuit according to a second embodiment. FIG. 11 illustrates a timing chart in which the differential output input to buffers 213 and 214 of the transmission circuit 210 of the communication circuits 200A-1 is transmitted to the communication circuits 200A-2 as a wireless signal from the coil 11, and the reception circuit 220A of the communication circuits 200A-2 restores the wireless signal received by the coil 12 to the differential output and outputs the differential output.

First, the operation of the communication circuits 200A-1 and 200A-2 at the timing t11 will be described. Because the operation of the transmission circuit 210 of the communication circuit 200A-1 is the same as that of the first embodiment, the description thereof will not be repeated.

At the timing t11, the signal output from the buffer 221 in the reception circuit 220A of the communication circuit 200A-2 varies from the H level to the L level in response to a change in the voltage across the coil 12. At the timing t11, because the value of the signal output from the buffer 221 varies within the first period K, the monitoring circuit 223 outputs an enable signal to the buffer 222.

The signal output from the buffer 221 is input to the delay circuit 224. Because the delay circuit 224 delays the signal output from the buffer 221 by a predetermined delay time T, the buffer 222 is activated, but the signal output from the buffer 221 is not restored.

Next, the operation of the reception circuit 220A of the communication circuits 200A-2 at the timing t12 will be described.

Timing t12 indicates when a predetermined delay time T has elapsed from timing t11. At the timing t12, the delay circuit 224 outputs a signal, input at the timing t11 from the buffer 221, to the buffer 222.

The signal output from the buffer 221 at the timing t11 is input to the buffer 222, restored to the differential output, and output.

Next, the operation of the reception circuit 220A of the communication circuits 200A-2 at the timing t13 will be described.

At the timing t13, the signal output from buffer 221 varies from the H level to the L level in response to a change in the voltage across coil 12.

At this time, the monitoring circuit 223B starts counting of the first period K in response to this change. Accordingly, at this time, the monitoring circuit 223B does not output an enable signal to the buffer 222. The delay circuit 224 also delays the signal output from the buffer 221 at the timing t13.

Next, the operation of the reception circuit 220A of the communication circuit 200A-2 at the timing t14 will be described.

The timing t14 indicates the point at which the first period K has elapsed from timing t13. In other words, the timing t14 indicates when a predetermined delay time T has elapsed from the timing t13.

At the timing t14, the monitoring circuit 223B outputs the enable signal to the buffer 222 to activate the buffer 222 to terminate the first period K count. The delay circuit 224 outputs a signal output from the buffer 221 to the buffer 222.

The buffer 222 is activated at the timing t14 and outputs a signal output from the buffer 221 as a differential output.

As described above, in this embodiment, the delay time T is about the same length as the first period K in which the data signal is counted by the monitoring circuit 223B. Therefore, the signal output from the buffer 221 is not input to the buffer 222 until the first period K counted by the monitoring circuit 223B has elapsed.

In other words, in this embodiment, the differential output output from the buffer 221 is not output to the LSI 2 until the count value of the monitoring circuit 223B is reset.

In this embodiment, the monitoring circuit 223B enables the buffer 222 following counting the first period K after the count value is reset. Therefore, in this embodiment, the signal output from the buffer 221 is input to the buffer 222 when the buffer 222 is activated.

Accordingly, according to this embodiment, when the signal waveform of the differential output input to the communication circuit 200A-1 is restored in the communication circuit 200A-2, it is possible to suppress the variation in the signal waveform due to the count period by the monitoring circuit 223, thereby improving the reproducibility of the signal waveform. Therefore, according to this embodiment, the accuracy of communication between the communication circuits 200A-1 and the communication circuits 200A-2 can be improved.

Figure 12:
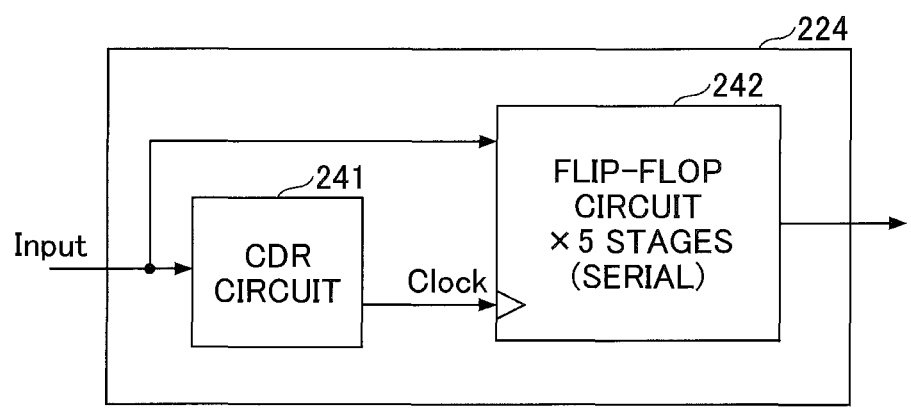
FIG. 12 illustrates an example of a delay circuit in the second embodiment.

Hereinafter, the delay circuit 224 of this embodiment will be described with reference to FIG. 12. FIG. 12 is a diagram illustrating an example of a delay circuit according to a second embodiment.

The delay circuit 224 illustrated in FIG. 12 is an example of a delay circuit corresponding to the monitoring circuit 223 illustrated in FIG. 7, for example.

The delay circuit 224 includes a CDR circuit 241 and a flip-flop circuit 242. The CDR circuit 241 separates the clock signal and the data signal contained in the signal output from the buffer 221 and outputs the clock signal to the later flip-flop circuit 242. The flip-flop circuit 242, for example, connects the flip-flop circuit to a five-stage serial connection and provides a delay time of five bits for the signal output from the buffer 221.

Figure 13:
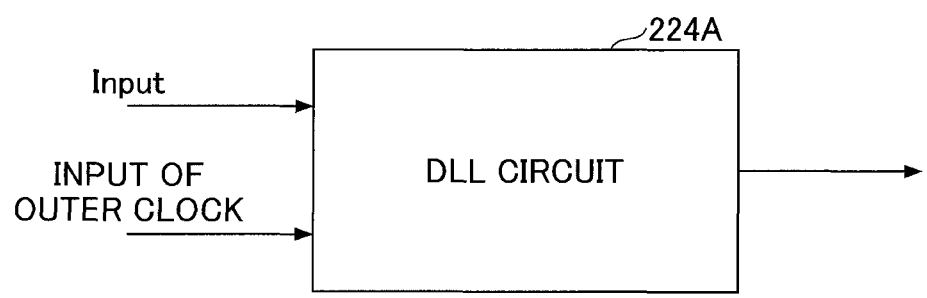
FIG. 13 illustrates another example of a delay circuit in the second embodiment.

FIG. 13 is a diagram illustrating another example of a delay circuit in a second embodiment. The delay circuit 224A illustrated in FIG. 13 is an example of a delay circuit corresponding to the monitoring circuit 223A illustrated in FIG. 8, for example.

In the example of FIG. 13, the DLL (Digital Locked Loop) circuit was used as the delay circuit 224A. In the delay circuit 224A, the delay time is adjusted with a clock signal input from an external source.

Figure 14:
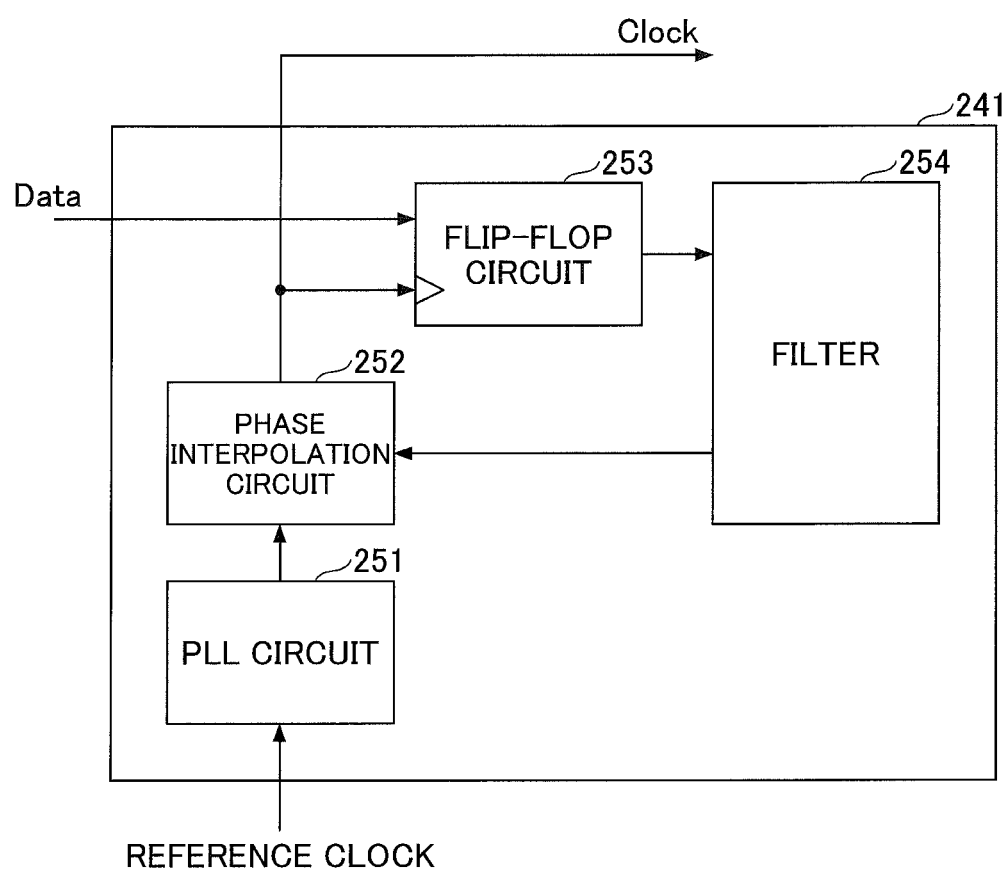
FIG. 14 illustrates an example of a CDR circuit according to the second embodiment.

Next, the CDR circuit 241 according to this embodiment will be described with reference to FIG. 14. FIG. 14 is a diagram illustrating an example of a CDR circuit according to a second embodiment.

The CDR circuit 241 includes, for example, a PLL (Phase Locked Loop) circuit 251, a phase interpolation circuit 252, a flip-flop 253, and a filter 254.

The phase interpolation circuit 252 generates a multiphase clock signal from the signal from which the PLL circuit 251 was generated based on the reference clock. The phase interpolation circuit 252 also compares the edge of the data signal detected by the flip-flop 253, the filter 254, with the multiphase clock signal to select and output the optimum clock signal.

Figure 15:
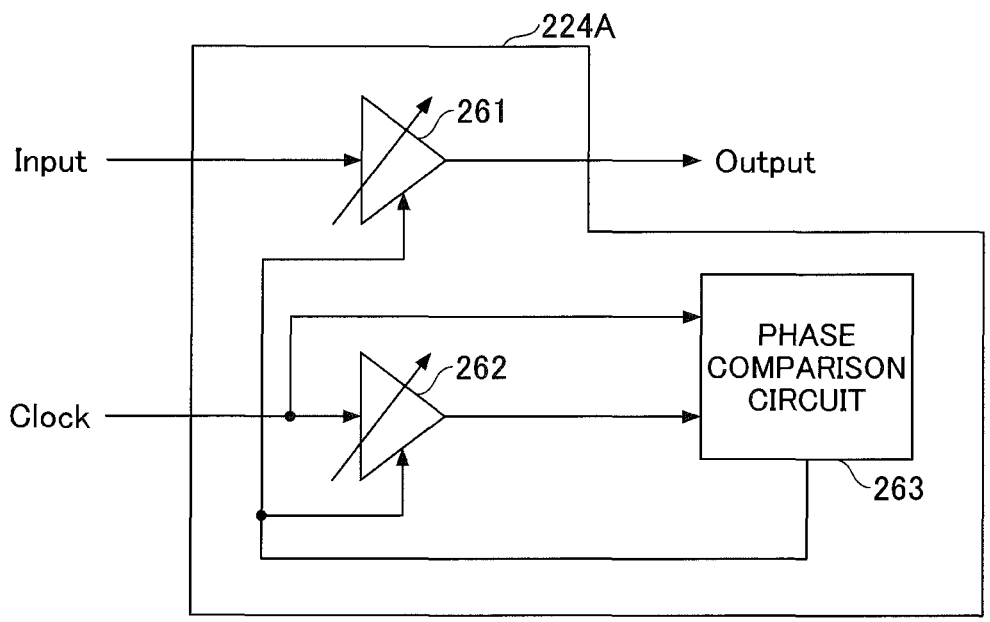
FIG. 15 illustrates another example of a delay circuit in the second embodiment.

Next, the delay circuit 234A (DLL circuit) of this embodiment will be described with reference to FIGS. 15 and 16. FIG. 15 is a diagram illustrating another example of the delay circuit according to the second embodiment, and FIG. 16 is a diagram illustrating an example of an operating waveform of a DLL circuit.

The delay circuit 224 in this embodiment includes the buffers 261, 262 for varying the value of delay and phase comparison circuit 263. A signal output from the buffer 221 is input to the buffer 261, and the signal output from the buffer 261 is the output signal of the delay circuit 224A.

A clock signal supplied from an external source is input to the buffer 262. The signal output from the buffer 262 is input to a phase comparison circuit 263. The signal output from the phase comparison circuit 263 is supplied to the buffers 261, 262. The signal output from the phase comparison circuit 263 is a signal that adjusts the delay time of the buffers 261 and 262.

Figure 16:
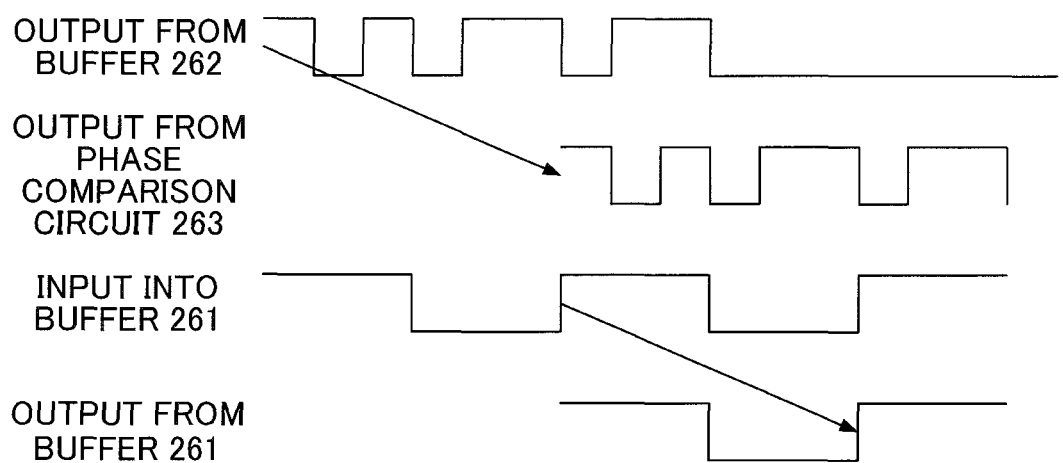
FIG. 16 is a diagram illustrating an example of an operating waveform of a DLL circuit.

In the delay circuit 224A, the phase comparison circuit 263 sets the delay time of one cycle of the externally input clock signal to the buffers 261 and 262, as illustrated in FIG. 16. In the delay circuit 224A, by setting the delay time in this manner, the signal input to the buffer 261 is delayed by 5 bits (first period K minutes) for output. At this time, the clock signal input to the delay circuit 224A is about ⅕ of the data rate of the data signal.

Modification

Figure 17:
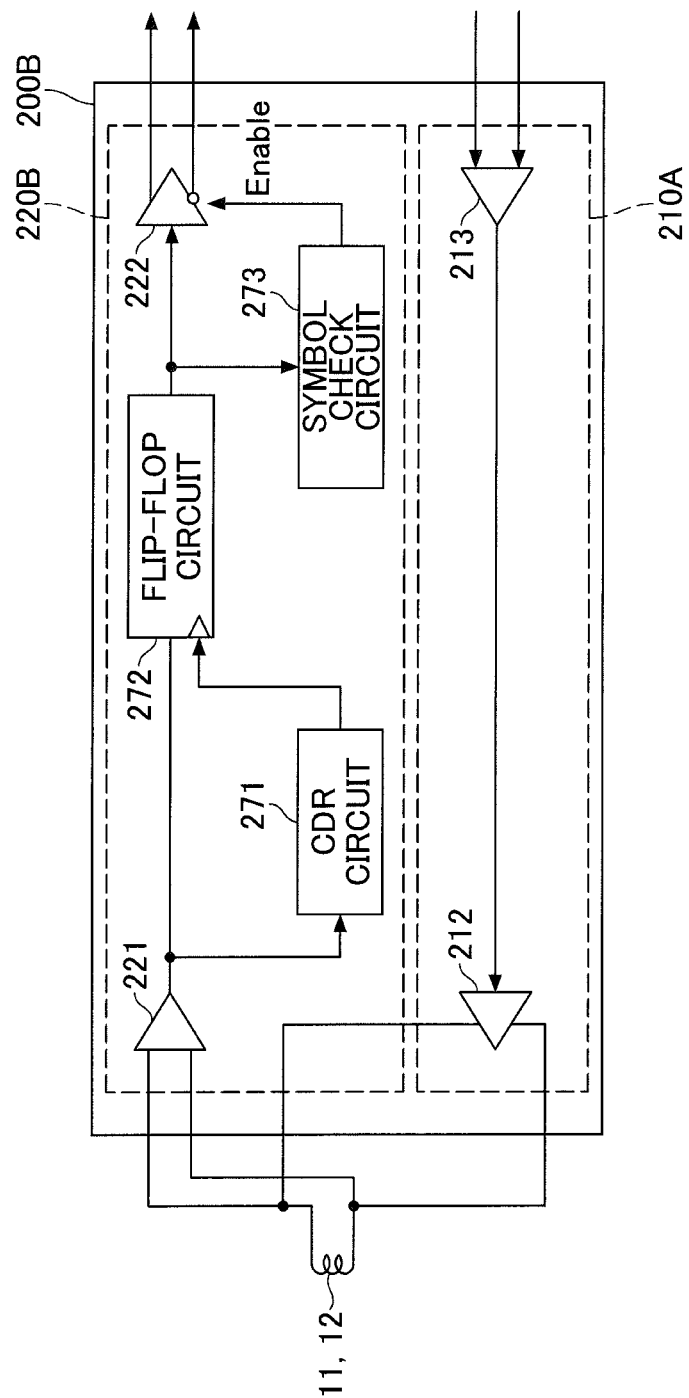
FIG. 17 is a first diagram illustrating a modification of the communication circuit.

Hereinafter, modifications of the first and second embodiments will be described with reference to FIGS. 17 to 19. FIG. 17 is a first diagram illustrating a modification of the communication circuit.

The communication circuit 200B illustrated in FIG. 17 includes a transmission circuit 210A and a reception circuit 220B. The transmission circuit 210A includes a buffer 212 and a buffer 213 and does not include the buffer 214 for forming the amplitude detection circuit 211. Accordingly, the transmission circuit 210A does not include the amplitude detection circuit 211.

The reception circuit 220B includes a buffer 221, a buffer 222, a CDR circuit 271, a flip-flop circuit 272, and a symbol check circuit 273.

The CDR circuit 271 and the flip-flop circuit 272 extract data signals from signals output from the buffer 221.

A symbol check circuit 273 determines whether the extracted data signal is a serial data signal used in the transmission by high speed communication.

The symbol check circuit 273 outputs an enable signal that activates the buffer 222 when the extracted data signal is a signal of the system used for transmission by high-speed communication. The symbol check circuit 273 outputs a disable signal that disables the buffer 222 when the extracted data signal is not a signal of the system used for high-speed communication.

As described above, in the example of FIG. 17, in the communication circuit 200B, a series of data signals is determined and activation/inactivation of the buffer 222 is controlled in accordance with the determination result. Accordingly, the communication circuit 200B can accurately transmit data signals transmitted and received between LSIs that perform high-speed communication.

In the example of FIG. 17, the communication circuit 200B includes, but is not limited to, a CDR circuit 271, a flip-flop circuit 272, and a symbol check circuit 273. The communication circuit 200B is provided, for example, within the LSI 2 on the receiving side and may use the CDR circuit 271, a flip-flop circuit 272, and the symbol check circuit 273 on the LSI 2. In this case, the communication circuit 200B may be integrated with the LSI 2. When the communication circuit 200B is integrated with the LSI 2, the communication circuit 200B can be applied to high-speed communication between the LSIs, thereby improving versatility.

Figure 18:
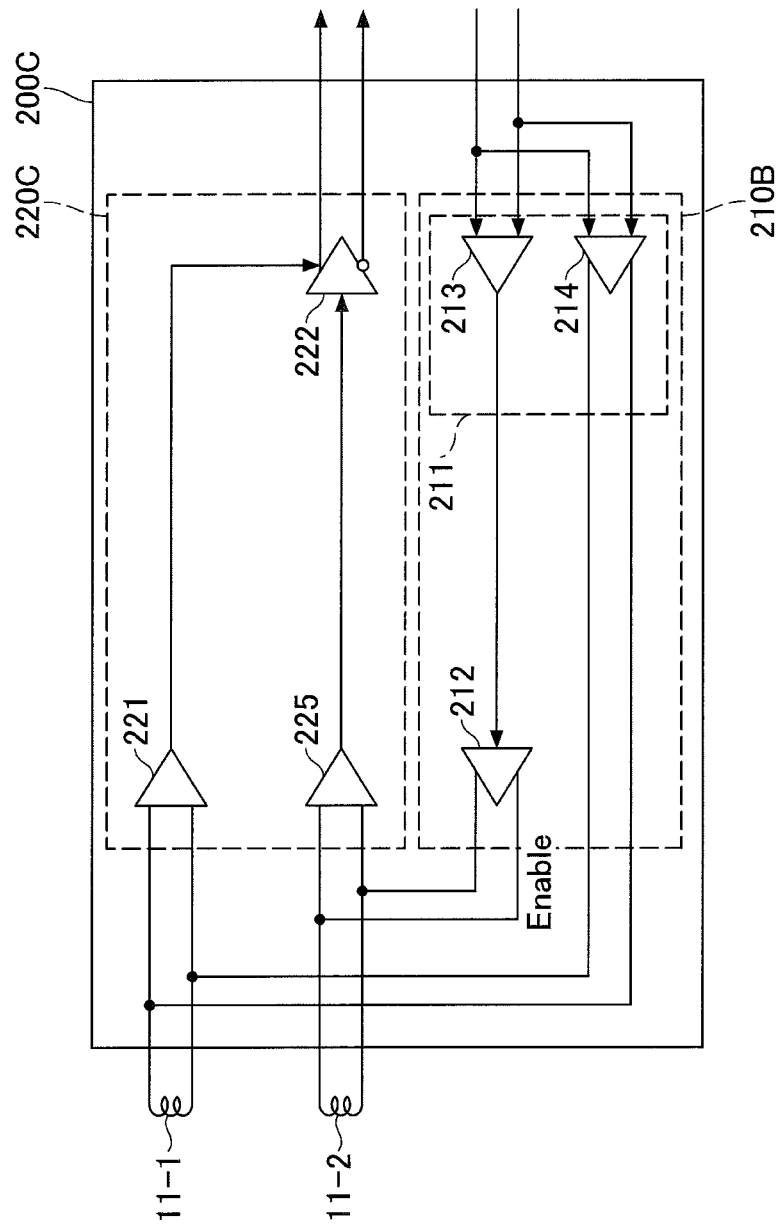
FIG. 18 is a second diagram illustrating a modification of the communication circuit.

FIG. 18 is a second diagram illustrating a modification of the communication circuit. The communication circuit 200C illustrated in FIG. 18 includes a transmission circuit 210B and a reception circuit 220C.

The communication circuit 200C is connected to a coil 11-1 for detecting whether there is a voltage difference (differential output) between the differential signal lines and a coil 11-2 for detecting a change point in the voltage difference (differential output) between the differential signal lines.

A transmission circuit 210B includes an amplitude detection circuit 211, and a buffer 212. In the transmission circuit 210B, the buffer 212 of the amplitude detection circuit 211 is connected to the coils 11-2, and the output of the buffer 214 is connected to the coils 11-1.

The voltage across coils 11-1 varies in response to a change in the signal output from the buffer 214. In other words, the voltage at both ends of the coil 11-1 changes when the difference of the voltage between the differential signal lines input from the LSI 1 becomes more than a certain value, from less than a certain value (when the differential output is detected) and when the difference of the voltage between the differential signal lines input from the LSI 1 becomes less than a constant value, from more than a constant value (when the differential output is not detected).

The buffer 214 outputs a H-level signal when the difference in voltage between the differential signal lines changes from less than a constant and more than a constant (when the differential output is detected), and outputs an L-level signal when the difference in voltage between the differential signal lines changes from more than a constant to less than a constant (when the differential output is not detected).

The voltage across coils 11-2 varies in response to a change in the signal output from the buffer 212. In other words, the voltage across the coil 11-2 varies when the differential output changes from the H level to the L level and when the differential output changes from the L level to the H level.

The reception circuit 220C includes a buffer 221, a buffer 222, and a buffer 225. The input of buffer 225 is connected to the coil 11-2, and the signal output from the buffer 225 varies in response to a change in the voltage across the coil 11-2.

The input of the buffer 221 is connected to the coil 11-1, and the signal output from the buffer 221 varies in response to a change in the voltage across coil 11-1. The signal output from the buffer 221 is input to the buffer 222 as a signal for controlling the validity or invalidation of the buffer 222.

More specifically, if the signal output from the buffer 221 is a H-level signal, the signal is an enable signal that activates the buffer 222. If the signal output from the buffer 221 is an L-level signal, the signal is a disable signal that inactivates the buffer 222. That is, the buffer 221 outputs a signal indicating whether there is a differential output.

The operation of the communication circuit 200C will be described below. In the communication circuit 200C-1 on the transmission side, the transmission circuit 210B is activated. In the communication circuit 200C-2 on the receiving side, the reception circuit 220C is activated.

In the transmission circuit 210B of the communication circuit 200C-1, for example, when the differential output from the LSI 1 input to the buffers 213 and 214 changes from the H level to the L level, the signal output from the buffer 212 changes from the H level to the L level, and the voltage at both ends of the coil 11-2 changes. Then, the voltage across the coil 11-2 of the communication circuit 200C-2 changes similarly, and the output signal of the buffer 225 changes from the H level to the L level. The signal output from the buffer 221 is input to the buffer 222. At this time, because the difference in voltage between the differential signal lines input from the LSI 1 is maintained at a constant or more, the output of the buffer 214 of the transmission circuit 210B maintains the H-level signal. Therefore, the output of the buffer 221 of the reception circuit 220C also maintains the H-level signal so that the buffer 222 remains valid.

Meanwhile, in the transmission circuit 210B of the communication circuit 200C-1, when the differential output input to the buffers 213 and 214 is lost, the difference in voltage between the differential signal lines from the LSI 1 changes from more than a predetermined value to less than the predetermined value so that the signal output from the buffer 214 changes from the H level to the L level, and the voltage across the coil 11-1 changes. Then, the voltage across the coil 11-1 of the communication circuit 200C-2 varies similarly, and the output signal of the buffer 225 changes from the H level to the L level, and the buffer 222 is inactivated.

Thus, according to the communication circuit 200C of FIG. 18, it is possible to detect both the change point of the differential output and the presence or absence of the differential output. Accordingly, the communication circuit 200C can be used for communication between LSIs in accordance with a high-speed communication standard so as to improve versatility.

Figure 19:
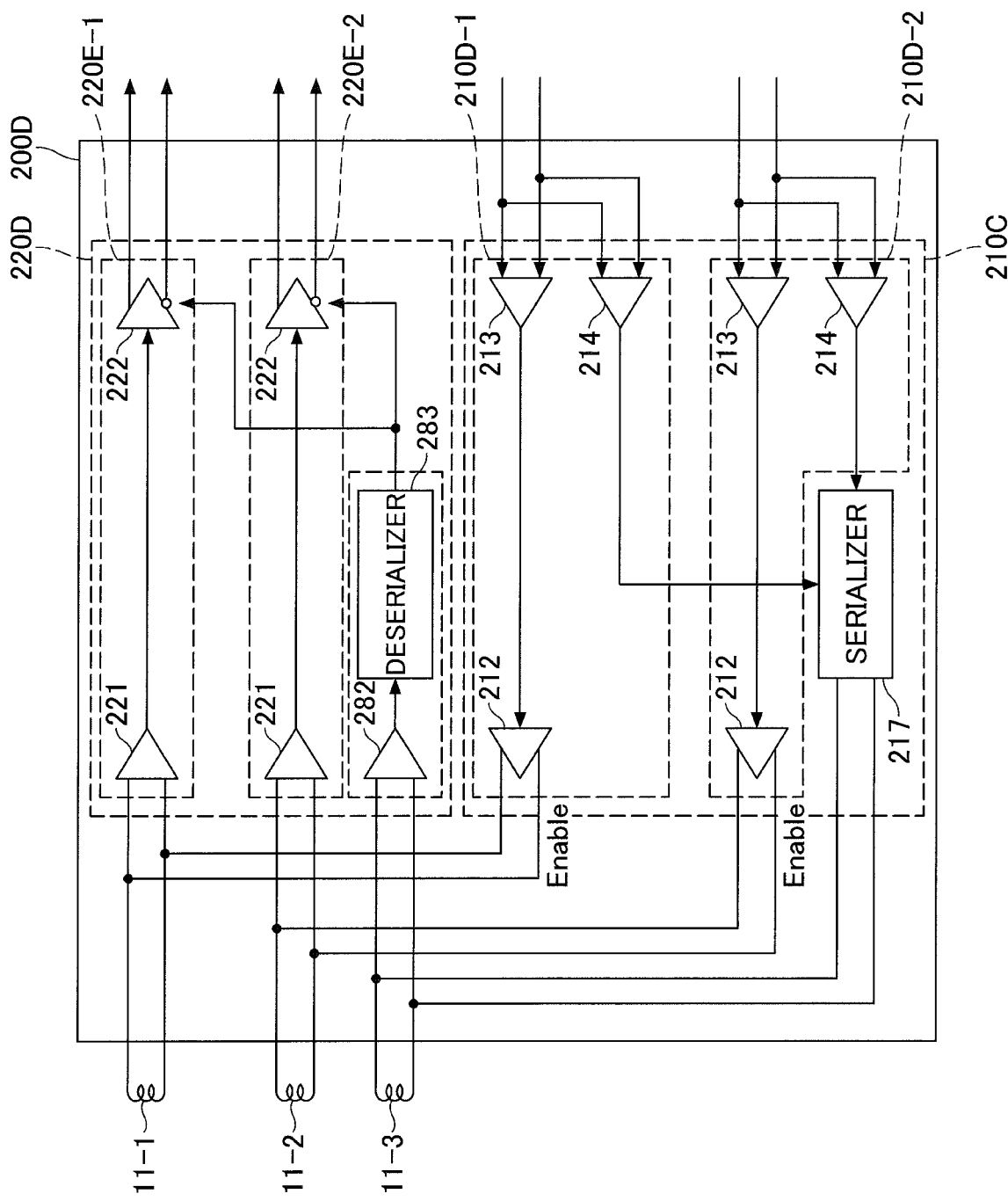
FIG. 19 is a third diagram illustrating a modification of the communication circuit.

FIG. 19 is a third diagram illustrating a modification of the communication circuit. The communication circuit 200D illustrated in FIG. 19 includes a plurality of transmission circuits and a plurality of reception circuits. A coil for notifying whether the differential output is present is shared by the plurality of transmission circuits and the plurality of reception circuits, noting that the frequency of the level change in the signal indicating whether the differential output is present is lower than that of the signal indicating the change point of the differential output.

The communication circuit 200D includes a transmission circuit 210C and reception circuit 220D. The transmission circuit 210C includes two systems of transmission circuits 210D-1 and 210D-2. The transmission circuit 210D-1 is connected to the coil 11-1, and the transmission circuit 210D-2 is connected to the coil 11-2.

The reception circuit 220D has two systems of a reception circuit 220E-1 and a reception circuit 220E-2. The reception circuit 220E-1 is connected to the coil 11-1, and the reception circuit 220E-2 is connected to the coil 11-2.

The communication circuit 200D is also connected to a coil 11-3. The coil 11-3 transmits a signal indicating whether a differential output is obtained from each of the two transmission circuits of the transmission circuit 210C as a wireless signal.

The coils 11-3 receive a signal indicating whether a differential output exists or not and transmit the signal to each of the two reception circuits of the reception circuit 220D.

That is, the coils 11-3 are shared as a coil for transmitting a signal indicating whether there is a differential output between a plurality of transmission circuits and a reception circuit provided by the communication circuit 200D.

In the communication circuit 200D, the transmission circuit 210C includes a plurality of transmission circuits 210D and a serializer 217.

The transmission circuit 210D includes a buffer 212, a buffer 213, and a buffer 214, and the signal output from the buffer 214 is input to a serializer 217.

The serializer 217 outputs a plurality of signals as a single signal. Specifically, for example, a parallel bus signal, such as 8 bits, is serialized to transmit a signal to a single transmission line. The signal output from the serializer 217 is output to both ends of the coil 11-3.

In the communication circuit 200D, the reception circuit 220D includes a plurality of reception circuits 220E, a buffer 282, and a deserializer 283.

The reception circuit 220E has a buffer 221 and a buffer 222. The input of buffer 282 is connected to both ends of the coil 11-3, and the output signal varies in response to a change in voltage across the coil coil 11-3. The signal output from the buffer 282 is input to the deserializer 238.

The deserializer 238 converts the serialized signal to a parallel signal. The signal output from the deserializer 238 is provided to the buffer 222 of each reception circuit 220E as a signal to control the availability or invalidation of the buffer 222.

As described above, in the example of FIG. 19, by sharing the coil for transmitting a signal indicating whether the differential output is present with a plurality of transmission circuits and reception circuits, the increase in the circuit configuration when a plurality of transmission circuits and reception circuits are provided in the communication circuit 200D can be suppressed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although a communication circuit has been described in detail, it should be understood that various changes, substitutions, and alterations could be made thereto without departing from the spirit and scope of the invention.

What is claimed is:

1. A communication circuit comprising:
a first buffer configured to output a signal indicative of a first logic state or a second logic state, a signal in which the first logic state and the second logic state are defined being input to the first buffer;
a second buffer configured to output a signal indicative of any one of the first logic state, the second logic state, and a third logic state, the signal output from the first buffer being input to the second buffer; and
a monitoring circuit configured to monitor whether a change between the first logic state and the second logic state occurs in the signal output from the first buffer, wherein:
in a case where the change between the first logic state and the second logic state does not occur in the signal output from the first buffer during a first period, the monitoring circuit causes the second buffer to output the signal indicative of the third logic state, and in a case where the change between the first logic state and the second logic state occurs in the signal output from the first buffer during the first period, the monitoring circuit causes the second buffer to output a signal having a same logic state as the signal output from the first buffer.

2. The communication circuit according to claim 1, wherein, when the change is detected in a case where the second buffer outputs the signal indicating the third logic state, the monitoring circuit causes the second buffer to output the signal indicative of the logic state indicated by the signal output from the first buffer.

3. The communication circuit according to claim 1, the communication circuit further comprising:

a delay circuit being provided between the first buffer and the second buffer and configured to delay the signal output from the first buffer for the first period.

4. The communication circuit according to claim 1, wherein, when the change is detected in a case where the second buffer outputs the signal indicating the third logic state, the monitoring circuit causes the second buffer to output the signal indicative of the logic state indicated by the signal output from the first buffer following an elapse of the first period after the change is detected.

5. The communication circuit according to claim 1, wherein the monitoring circuit includes a counter which is configured to be reset at each change of a logic state indicated by the signal output from the first buffer, and wherein the monitoring circuit outputs a signal for inactivating the second buffer to the second buffer when the counter counts to a first value corresponding to the first period.

6. The communication circuit according to claim 4, wherein the monitoring circuit includes a counter which is configured to be reset at each change of a logic state indicated by the signal output from the first buffer, wherein, when a count value of the counter before the resetting is less than a first value corresponding to the first period, the monitoring circuit outputs a signal for activating the second buffer to the second buffer in synchronization with a reset of the counter, and wherein, when the count value of the counter before the resetting is equal to or greater than the first value, the monitoring circuit outputs the signal for activating the second buffer to the second buffer following the counter counting to the first value after the resetting.

7. The communication circuit according to claim 1, the communication circuit comprising:

a third buffer, a signal in which the first logic state, the second logic state, and the third logic state are defined being input to the third buffer;

a fourth buffer configured to output a signal indicative of the first logic state or the second logic state, a signal output from the third buffer being input to the fourth buffer; and a fifth buffer configured to output a signal for inactivating the fourth buffer to the fourth buffer when detecting that the input signal is in the third logic state, the signal in which the first logic state, the second logic state, and the third logic state are defined being input to the fifth buffer.

8. The communication circuit according to claim 1, wherein the first period is a period of time during which a same logic state is allowed to continue in a signal transmitted or received by an integrated circuit to which the signal output from the second buffer is supplied.

9. A communication system, comprising:

a transmission circuit;

a reception circuit disposed close to the transmission circuit; and a coupler configured to couple between transmission lines of the transmission circuit and the reception circuit by electromagnetic field coupling, wherein wireless communication is performed between the transmission circuit and the reception circuit, and wherein the reception circuit includes:

a first buffer configured to output a signal indicative of a first logic state or a second logic state, a signal in which the first logic state and the second logic state are defined being input to the first buffer;

a second buffer configured to output a signal indicative of any one of the first logic state, the second logic state, and a third logic state, the signal output from the first buffer being input to the second buffer; and a monitoring circuit configured to monitor whether a change between the first logic state and the second logic state occurs in the signal output from the first buffer, wherein in a case where the change between the first logic state and the second logic state does not occur in the signal output from the first buffer does not occur during a first period, the monitoring circuit causes the second buffer to output the signal indicative of the third logic state, and wherein in a case where the change between the first logic state and the second logic state occurs in the signal output from the first buffer during the first period, the monitoring circuit causes the second buffer to output a signal having a same logic state as the signal output from the first buffer.

10. The communication system according to claim 9, wherein, when the change is detected in a case where the second buffer outputs the signal indicating the third logic state, the monitoring circuit causes the second buffer to output the signal indicative of the logic state indicated by the signal output from the first buffer.

11. The communication system according to claim 9, the communication system further comprising:

a delay circuit being provided between the first buffer and the second buffer and configured to delay the signal output from the first buffer for the first period.

12. The communication system according to claim 9, wherein, when the change is detected in a case where the second buffer outputs the signal indicating the third logic state, the monitoring circuit causes the second buffer to output the signal indicative of the logic state indicated by the signal output from the first buffer following an elapse of the first period after the change is detected.

13. A communication method by using a communication circuit, the communication method comprising:

outputting, by a first buffer, a signal indicative of a first logic state or a second logic state, a signal in which the first logic state and the second logic state are defined being input to the first buffer;

outputting, by a second buffer, a signal indicative of any one of the first logic state, the second logic state, and a third logic state, the signal output from the first buffer being input to the second buffer, causing a monitoring circuit to monitor whether a change between the first logic state and the second logic state occurs in the signal output from the first buffer, in a case where the change between the first logic state and the second logic state does not occur in the signal output from the first buffer does not occur during a first period, causing, by the monitoring circuit, the second buffer to output the signal indicative of the third logic state, and in a case where the change between the first logic state and the second logic state occurs in the signal output from the first buffer during the first period, causing, by the monitoring circuit, the second buffer to output a signal having a same logic state as the signal output from the first buffer.

14. The communication method according to claim 13, wherein, when the change is detected in a case where the second buffer outputs the signal indicating the third logic state, the monitoring circuit causes the second buffer to output the signal indicative of the logic state indicated by the signal output from the first buffer to be output to the second buffer.

15. The communication method according to claim 13, wherein a delay circuit provided between the first buffer and the second buffer causes the signal output from the first buffer to delay for the first period.

16. The communication method according to claim 15, wherein, when the change is detected in a case where the second buffer outputs the signal indicating the third logic state, the monitoring circuit causes the second buffer to output the signal of the logic state indicated by the signal output from the first buffer following an elapse of the first period after the change is detected.

* * * * *